United States Patent [19]
Itoh

[11] Patent Number: 5,452,196
[45] Date of Patent: Sep. 19, 1995

[54] PROTECTION SYSTEM FOR THYRISTOR VALVE HAVING FIRST AND SECOND REVERSE VOLTAGE DETECTION CIRCUITS

[75] Inventor: Katsuro Itoh, Tokyo, Japan

[73] Assignee: Kabushiki Kaisha Toshiba, Kawasaki, Japan

[21] Appl. No.: 281,785

[22] Filed: Jul. 28, 1994

[30] Foreign Application Priority Data
Aug. 19, 1993 [JP] Japan .................... 5-204905

[51] Int. Cl.⁶ .......................................... H02H 7/125
[52] U.S. Cl. .......................................... 363/54
[58] Field of Search ................. 363/27, 28, 50, 54, 363/57, 85, 96, 128, 135; 361/89, 90, 91

[56] References Cited
U.S. PATENT DOCUMENTS

| | | | |
|---|---|---|---|
| 4,223,236 | 9/1980 | Iyotani et al. | 307/252 Q |
| 4,536,816 | 8/1985 | Matsumura et al. | 361/91 |
| 4,651,251 | 3/1987 | Thiele | 361/91 |
| 4,757,436 | 7/1988 | Ueda et al. | 363/54 |
| 5,265,002 | 11/1993 | Bando et al. | 363/54 |
| 5,309,346 | 5/1994 | Gyugyi | 363/54 |

Primary Examiner—Steven L. Stephan
Assistant Examiner—Matthew V. Nguyen
Attorney, Agent, or Firm—Limbach & Limbach

[57] ABSTRACT

A protection system for a thyristor valve composed of a plurality of thyristors connected in series. The protection system includes a forward voltage detection circuit for generating a forward voltage signal, a first reverse voltage detection circuit for detecting that a reverse voltage in excess of a first reverse voltage level is applied to the thyristor to generate a first reverse voltage signal, and a second reverse voltage detection circuit for detecting that a reverse voltage in excess of a second reverse voltage level larger than the first reverse voltage level is applied to the thyristor to generate a second reverse voltage signal. The protection system further includes a protection circuit for detecting a first time period during when the first reverse voltage signal is outputted and a second time period during when the first reverse voltage signal is outputted and the second reverse voltage signal is not outputted, for adding the first and the second time periods to generate an addition signal, for generating a decision signal when the addition signal is smaller than a second predetermined value, and for generating a protection gate pulse based on the decision signal when the forward voltage is applied to the thyristor. The protection gate pulse is applied to all of the thyristors.

7 Claims, 5 Drawing Sheets

PROTECTION SYSTEM FOR THYRISTOR VALVE HAVING FIRST AND SECOND REVERSE VOLTAGE DETECTION CIRCUITS

BACKGROUND OF THE INVENTION

1. Field of the Invention

This invention relates to a protection system for a thyristor valve used for DC power transmission e.t.c., and more particularly to a protection system for a thyristor valve which protects thyristors from voltage stress during the forward recovery period.

2. Description of the Related Art

Generally, a thyristor does not recover its forward withstand voltage until a certain time has elapsed after the end of power conduction. The "turn-OFF time" (Tq) is a guide to the time required for this recovery.

When a thyristor valve is running as an inverter, the reverse voltage period applied to the thyristor after the end of power conduction is called the "margin angle" ($\gamma$). Normally, the control angle is selected to that this margin angle $\gamma$ is greater than turn-OFF time Tq.

When margin angle $\gamma$ is smaller than turn-OFF time Tq due to the generation of waveform distortion in the AC system, the thyristor cannot block a forward voltage applied following a reverse voltage, and self-fires. This phenomenon is called "commutation failure". When thyristors are connected in series, randomness will occur in turn-OFF times Tq of individual thyristors. Therefore, when margin angle $\gamma$ is small, there will be thyristors with and without commutation failure. This phenomenon is called "partial commutation failure". Thus, the whole circuit voltage will be applied to the thyristors without commutation failure. Therefore, when the number of thyristors with partial commutation failure is large, a forward voltage greater than the withstand voltage will be applied to the thyristors which block the voltage. This will sometimes lead to damage.

To counter this problem, in prior art, the thyristors were protected by forcibly turning them on by supplying a gate pulse to all the thyristors, if margin angle $\gamma$ became smaller than the maximum value of turn-OFF times Tq of the series thyristors. This is called "forced firing protection".

The details of the above-described prior art protection were well described in U.S. Pat. No. 4,377,835 issued on Mar. 22, 1983 and Canadian Patent No. 1,054,218 issued on May 8, 1979.

Such prior art forced firing protection had the following problems. That it to say, turn-OFF time Tq depends on the rising rate dv/dt of the applied forwardly rising voltage v and peak value of voltage v. However, the maximum value of turn-OFF times Tq used in prior art forced firing protection which is taken as TqO was assumed from rising rate dv/dt (several v/$\mu$s) in normal operation. When an overload voltage with a larger rising rate dv/dt than in normal operation is applied to the thyristor valve from outside, due to a lightning surge or the action of an ON/OFF device, turn-OFF times of individual thyristors Tq which are taken as Tq1 became greater than turn-OFF time TqO. Turn-OFF times Tq1 has randomness for individual thyristors in the same way as turn-OFF time TqO.

Consequently, if a surge voltage penetrates into the thyristor valves between the turn-OFF Times Tq0 and Tq1 after the end of power conduction, the above forced firing protection will not operate. However, partial commutation failure will occur due to the randomness of turn-OFF times Tq1 of individual thyristors, and there is a possibility of damaging the thyristors.

Also, when a forwardly rising voltage v with a large rising rate dr/dr is applied to the thyristors, and peak value of voltage v at that time is high, all the thyristors connected in series will self-fire. Thus, there is a possibility of damage due to loss at the time of turn-ON.

SUMMARY OF THE INVENTION

Accordingly, one object of this invention is to provide a protection system for a thyristor valve which can protect the thyristors from being damaged, even if a surge steep voltage penetrates into the thyristor valve.

These and other objects of this invention can be achieved by providing a protection system for a thyristor valve composed of a plurality of thyristors connected in series. The protection system includes a forward voltage detection circuit connected to at least one thyristor out of the plurality of the thyristors for detecting that a forward voltage is applied to the thyristor to generate a forward voltage signal, a first reverse voltage detection circuit for detecting that a reverse voltage in excess of a first reverse voltage level is applied to the thyristor to generate a first reverse voltage signal, and a second reverse voltage detection circuit for detecting that a reverse voltage in excess of a second reverse voltage level larger than the first reverse voltage level is applied to the thyristor to generate a second reverse voltage signal. The protection system further includes a protection circuit for detecting a first time period during when the first reverse voltage signal is outputted and a second time period during when the first reverse voltage signal is outputted and the second reverse voltage signal is not outputted, for adding the first time period and the second time period to generate an addition signal, for comparing the addition signal with a first predetermined value to generate a decision signal when the addition signal is smaller than the second predetermined value, and for generating a protection gate pulse based on the decision signal when the forward voltage is applied to the thyristor. The protection gate pulse is applied to all of the thyristors.

According to one aspect of this invention, there is provided a protection system for a thyristor valve composed of a plurality of thyristors connected in series. The protection system includes a forward voltage detection circuit connected to at least one thyristor out of the plurality of the thyristors for detecting that a forward voltage is applied to the thyristor to generate a forward voltage signal, a first reverse voltage detection circuit for detecting that a reverse voltage in excess of a first reverse voltage level is applied to the thyristor to generate a first reverse voltage signal, and a second reverse voltage detection circuit for detecting that a reverse voltage in excess of a second reverse voltage level larger than the first reverse voltage level is applied to the thyristor to generate a second reverse voltage signal. The protection system further includes a protection circuit for calculating a signal dependent on rising rate of a forwardly rising voltage applied to the thyristor based on the first reverse voltage signal and the second reverse voltage signal when the reverse voltage is applied to the thyristor, for comparing the rising rate dependent signal with a second predetermined value to generate a decision signal when the rising rate dependent signal indicates that the rising rate is larger than a predetermined value, and for generating a protection gate pulse based on the decision signal when the forward voltage is applied to the thyristor. The protection gate pulse is applied to all of the thyristors.

It has been proved empirically that the relationship between turn-OFF time Tq and a rising rate dv/dt of forwardly rising voltage v is given by the following equation.

$$Tq = k1 \cdot \ln(dv/dt) + T0 \qquad (1)$$

Here, K1 and T0 are constants.

Therefore, taking account of the randomness in the characteristic of each thyristor, this invention has the characteristic that when Equation (2) is not established, protection is carried out through forced turn-ON by supplying gate pulses to all the thyristors based on the detection of rising rate dv/dt of forwardly rising voltage v carried out by reverse voltages of two different levels of a thyristor.

Equation (2) is obtained by substituting Equation (1) into Equation ($\gamma > Tq$).

$$\gamma > K1 \cdot \ln(dv/dt) + T0 + Tm \qquad (2)$$

Here, Tm is a margin which takes account of the randomness in the characteristic of a thyristor.

By providing the above means, damage to the thyristors due to an over-voltage can be prevented, because forced firing pulse signals are applied to all the thyristors when an over voltage penetrates into a thyristor valve and a forwardly rising voltage v with a steep rising rate dv/dt is applied to the thyristors after the end of the conducting period.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
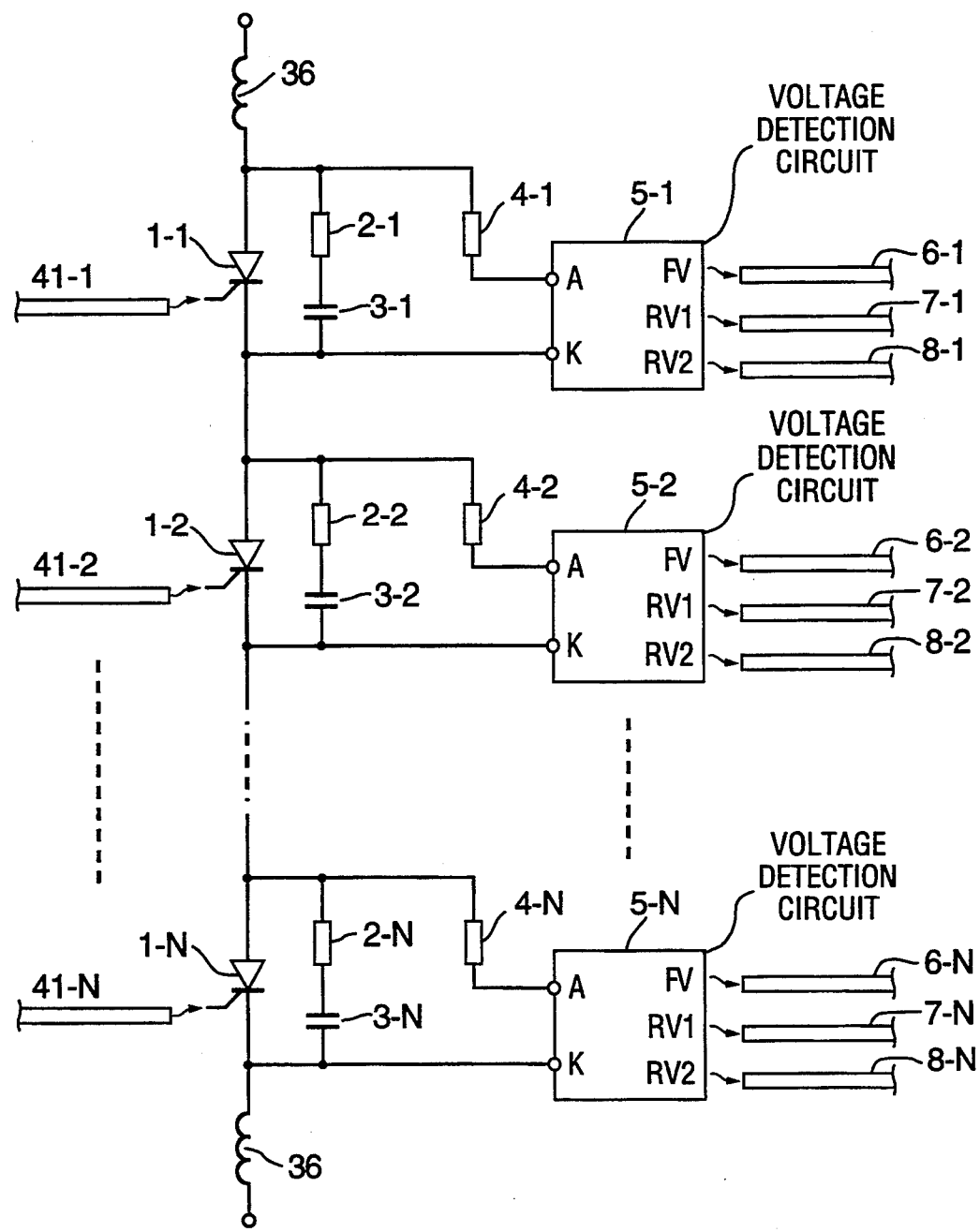
FIG. 1 is a schematic diagram of a thyristor valve and a part of a protection system thereof according to an embodiment of this invention.

Referring now to the drawings, wherein like reference numerals designate identical or corresponding parts throughout the several views, the embodiments of this invention will be described below.

Figure 2:
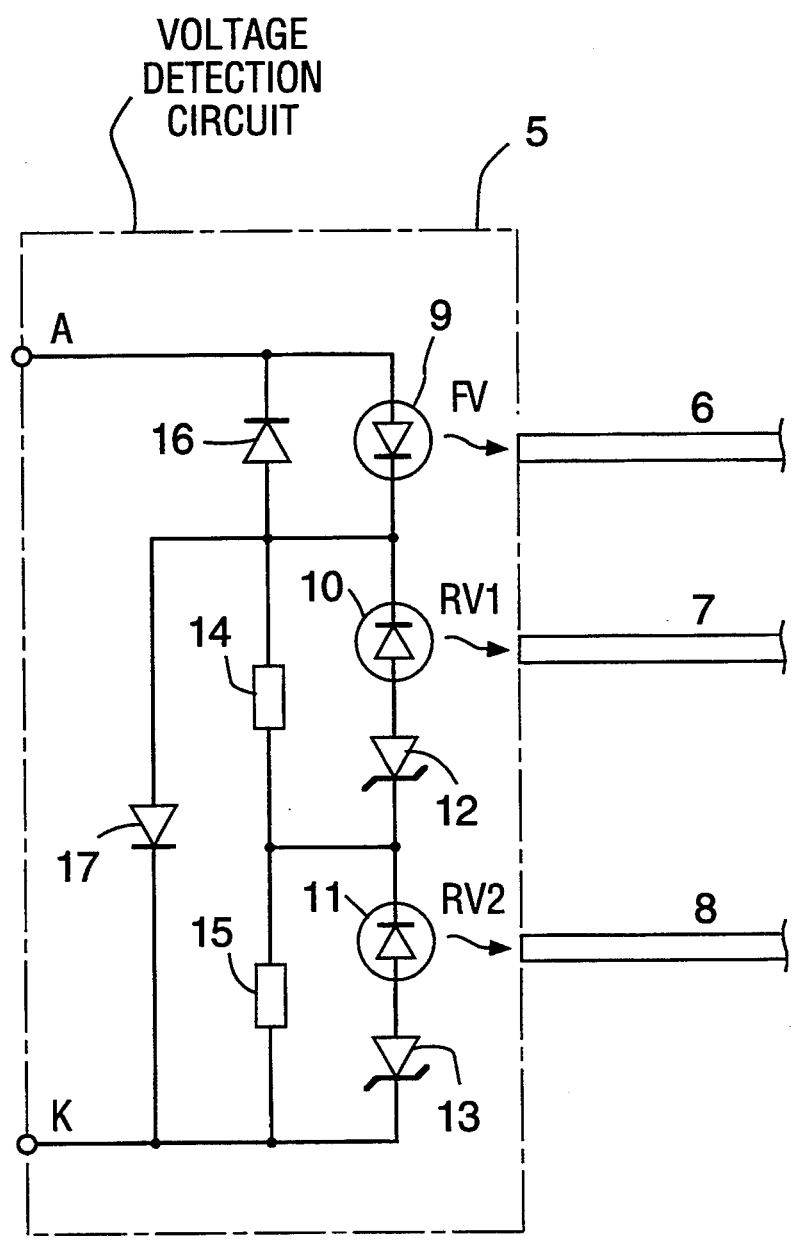
FIG. 2 is a schematic diagram showing a practical example of a voltage detection circuit shown In FIG. 1.
Figure 3:
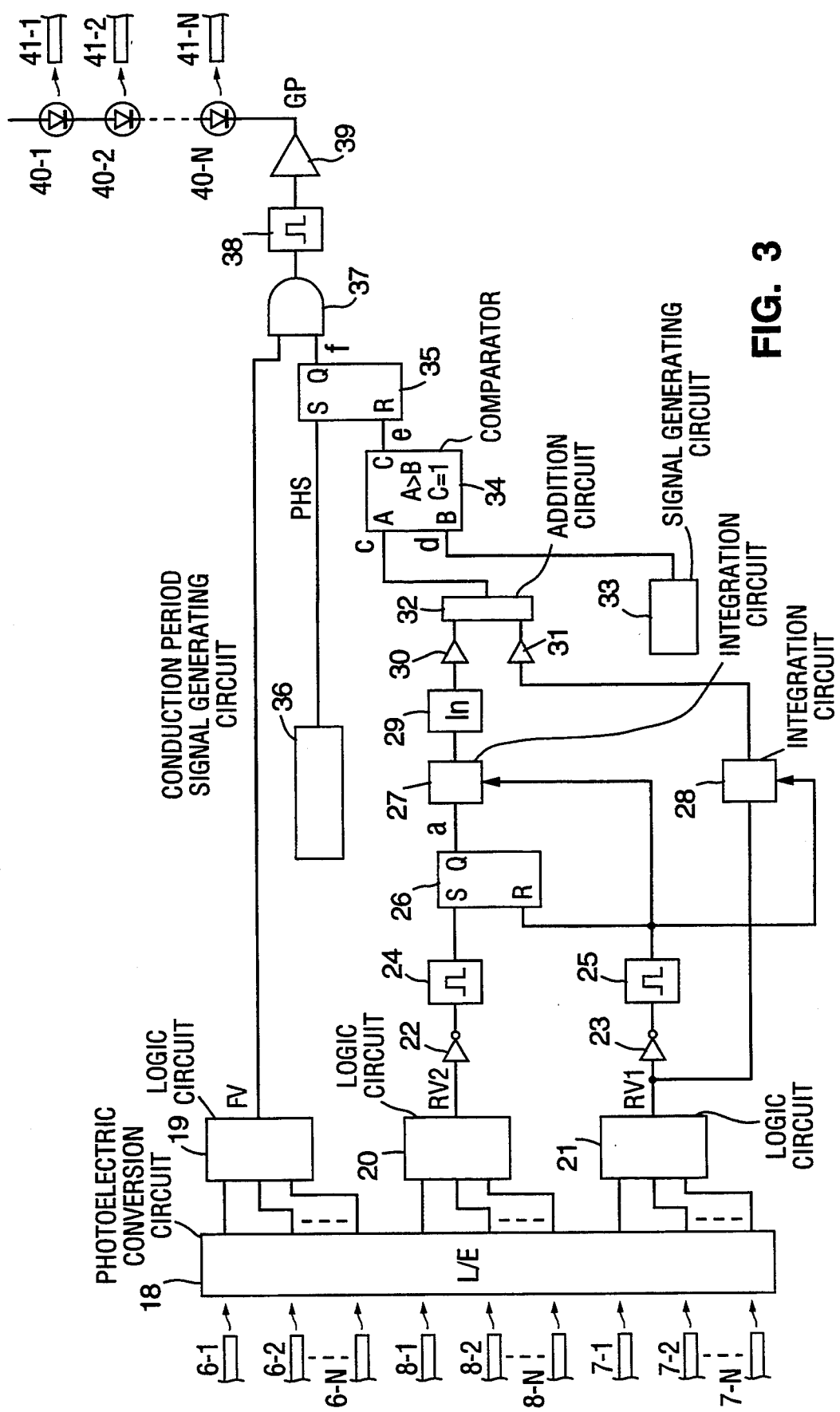
FIG. 3 is a schematic diagram of a pulse generating circuit which generates protection pulses according to an embodiment of this invention.

FIG. 1 is a schematic diagram of a thyristor valve and a part of a protection system thereof according to an embodiment of this invention. FIG. 2 is a schematic diagram showing a practical example of a voltage detection circuit in FIG. 1. FIG. 3 is a schematic diagram of a pulse generating circuit which applies forced firing pulses to the thyristor valve in FIG. 1.

N photo-thyristors (hereafter simply "thyristors") 1-1-1-N are connected in series to that they will withstand a specific voltage. Snubber circuits consisting of series connected snubber resistors 2-1-2-N and snubber capacitors 3-1-3-N are connected in parallel with thyristor 1-1-1-N, respectively. At the same time, DC voltage dividing resistors 4-1-4-N and voltage detection circuits 5-1-5-N are connected in parallel with thyristors 1-1-1-N, respectively.

As simply shown as a voltage detection circuit 5 in FIG. 2, each of voltage detection circuits 5-1-5-N is composed of LEDs 9, 10 and 11, Zener diodes 12 and 13, resistors 14 and 15 and diodes 16 and 17. In FIG. 2, each of light guides 6-1-6-N, each of light guides 7-1-7-N and each of light guides 8-1-8-N are simply shown as a light guide 6, a light guide 7 and a light guide 8, respectively.

When a forward voltage is applied to thyristors 1-1-1-N in FIG. 1, LEDs 9 in voltage detection circuits 5-1-5-N emit lights. These lights are transmitted by light guides 6-1-6-N to a photoelectric conversion circuit 18 in FIG. 3 which is at earth potential. Photoelectric conversion circuit 18 converts these lights into electric signals, which are supplied to a logic circuit 19. These electric signals are intensified by logic circuit 19 to become a forward voltage signal FV.

Also, when a reverse voltage of more than a specified value VR1 (for instance, 50 V) is applied to thyristors 1-1- 1-N, LEDs 10 emit lights which ape transmitted by light guides 7-1-7-N to photoelectric conversion circuit 18 which is at earth potential. These are converted into electric signals in photoelectric conversion circuit 18, which are intensified by a logic circuit 21 to become a signal RV1. Furthermore, when a reverse voltage of more than a specified value VR2 (for instance, 200 V) is applied to thyristors 1-1-1-N, LEDs 11 emit lights which are transmitted by light guides 8-1-8-N to photoelectric conversion circuit 18 which is at earth potential. These are converted into electric signals in photoelectric conversion circuit 18, which are intensified by a logic circuit 20 to become a signal RV2. Logic circuits 19, 20 and 21 can be easily composed of OR circuits, AND circuits or majority circuits by those skilled in the art. So that detailed description of the circuit construction thereof may be omitted.

Signal RV2 is inverted by an inversion circuit 22 and causes a mono-multi circuit 24 to operate to set a flip-flop 26. Signal RV1 is inverted by an inversion circuit 23 and causes a mono-multi circuit 25 to operate to reset flip-flop 26.

A Q output a of flip-flop 26 operates an integration circuit 27. Signal RV1 also operates an integration circuit 28. Here, the resetting of integration circuits 27 and 28 is performed by the output signal of mono-multi circuit 25. The output of integration circuit 27 is applied to an addition circuit 32 by passing through a logarithmic circuit 29 and an amplifier circuit 30 which has a specified gain.

On the other hand, the output of integration circuit 28 is applied to addition circuit 32 by passing through an amplifier circuit 31 which has a specified gain. That is to say, an output c of addition circuit 32 is the sum of the output of amplifier circuit 30 and the output of amplifier circuit 31.

A signal generating circuit 33 is a circuit which produces a DC signal d equivalent to $K1\cdot \ln(VR2-VR1)+T0+Tm$. A comparator 34 inputs signal c and signal d, and its output e is "1" when $c>d$.

A conduction period signal generating circuit 36 outputs a signal PHS, which is the conduction period signal of the thyristor valve, and sets a flip-flop 35 by signal PHS. Flip-flop 35 is reset by output e of comparator 34. A Q output f of flip-flop 35 is inputted to an AND circuit 37. Signal FV which is the output of logic circuit 19, is inputted to another input terminal of AND circuit 37. When both signal FV and signal f are "1", a mono-multi 38 is operated and an amplifier circuit 39 is driven to cause LEDs 40-1-40-N to emit lights by a signal GP. These lights are transmitted to thyristors 1-l-1-N via light guides 41-l-41-N to turn ON all thyristors 1-l-1-N.

Figure 4:
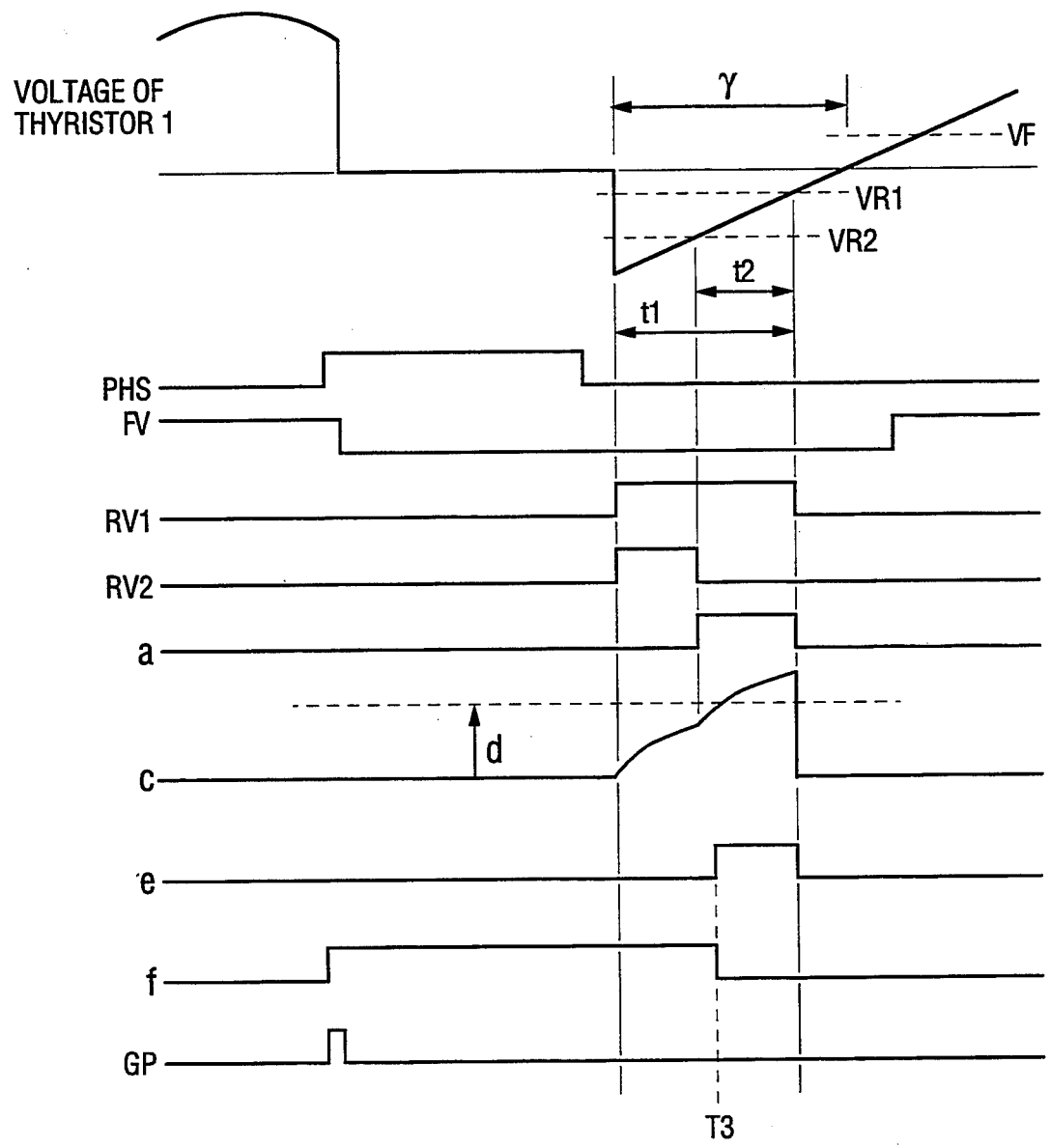
FIG. 4 is a waveform diagram for each part during normal operation to illustrate the operation of this embodiment.
Figure 5:
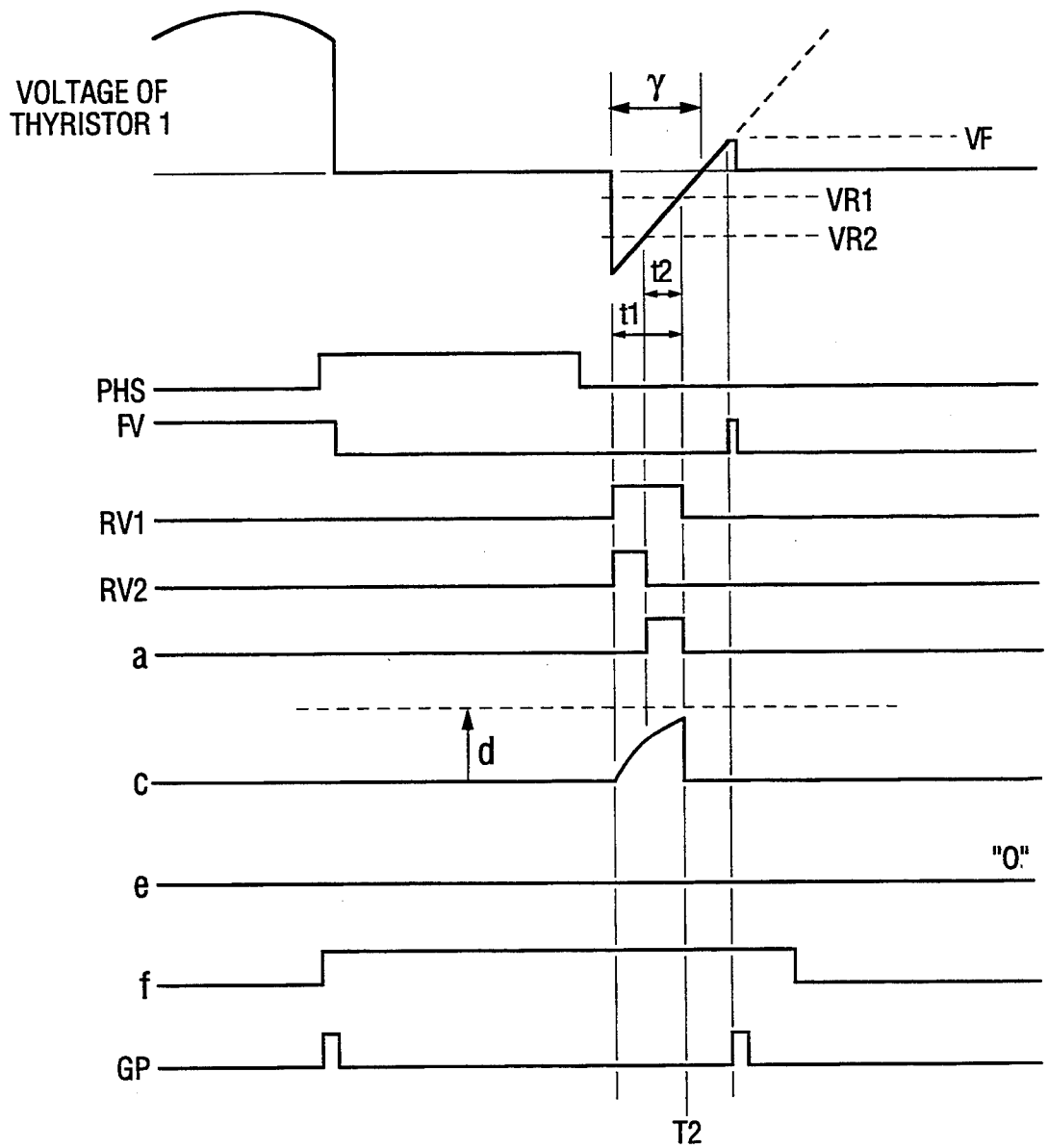
FIG. 5 is a waveform diagram for each part during surge voltage penetration to illustrate the operation of this embodiment.

The following is a description of the operation of the embodiment of this invention composed as above, with reference to FIG. 4 and 5.

FIG. 4 is the waveforms of parts of a thyristor valve during normal inverter operation. When signal PHS which is the output of conduction period signal generating circuit 36 becomes "1" in the forward voltage period of thyristors 1-1-1-N, flip-flop 35 is set. In this period, signal FV of logic circuit 19 is "1". Thus, the two inputs of AND circuit 37 become "1" and mono-multi 38 and amplifier circuit 39 are driven. Thus, LEDs 40-l-40-N emit lights and turn ON thyristor 1-l-1-N. Then signal FV becomes "0". After that, when signal PHS becomes "0", the current flowing in this thyristor valve will commutate to the thyristor valve of another phase (not illustrated), thyristors 1-l-1-N in this thyristor valve are turned OFF. During the time 7 after thyristors 1-l-1-N are turned OFF, a reverse voltage will be applied to thyristors 1-1-1-N. The reverse voltage applied to thyristors 1-l—1-N will be larger than the level of voltage VR2 under the normal condition. Therefore, as soon as thyristors 1-l-1-N are turned OFF, signals RV1 and RV2 will become "1". While signal RV1 is "1", integration circuit 28 operates and measures a period t1 in which the reverse voltage is applied to thyristors 1-1—1-N. Strictly speaking, period t1 is the time when the reverse voltage is larger than voltage VR1. But in practice, when voltage VR1 is about 50 V, time t1 can be regarded as identical with margin angle γ. Also, when the absolute value of the reverse voltage is below voltage VR2, mono-multi 24 operates to set flip-flop 26. Thus, integration circuit 27 operates to measure the time t2 until the reverse voltage becomes voltage VR1 from voltage VR2. When the reverse voltage further reduces and becomes less than voltage VR1, flip-flop 26, integration circuit 27 and integration circuit 28 are reset to end the measurement of time t1 and time t2. The rising rate dv/dt of the thyristor at this time can be obtained from the following equation.

$$(dv/dt) = (VR2 - VR1)/t2 \quad (3)$$

Also, since time t1 can be regarded as margin angle γ, Equation (2) can be rewritten as follows.

$$\gamma = t1 > k1 \cdot \ln[(VR2 - VR1)/t2] + T0 + Tm \quad (4)$$
$$t1 > k1 \cdot [\ln(VR2 - VR1) - \ln(t2)] + T0 + Tm$$
$$t1 + k1 \cdot \ln(t2) > k1 \cdot \ln(VR2 - VR1) + T0 + Tm$$

In Equation (4), as opposed to the fact that the right-hand term $[K1\cdot \ln(VR2-VR1)+t0+Tm]$ is constant, the left-hand term $[t1+K1\cdot \ln(t2)]$ varies depending on the magnitude of the rising rate dv/dt of voltage v applied to the thyristor. If rising rate dv/dt becomes greater, Equation (4) will not be established.

This invention is designed to output a protection pulse to forcibly fire all the thyristors under the conditions when Equation (4) has not been established. That is to say, in FIG. 3, the gains of amplifiers 30 and 31 are set so that the output of amplifier 30 is $K1\cdot \ln(t2)$ and the output of amplifier 31 is t1. Then, output c of addition circuit 32 will be $[t1+R1\cdot \ln(t2)]$. Output d of signal generating circuit 33 is set so that it becomes $[K1\cdot \ln(VR2-VR1)+T0+Tm]$.

During normal operation, as shown in FIG. 4, output c of addition circuit 32 at time T3 becomes greater than output d of signal generating circuit 33. That is to say, Equation (4) is established, and output e of comparator 34 becomes "1" and resets flip-flop 35, and the output of flip-flop 35 becomes "0". Thus, light-emitting diodes 40-l-40-N do not receive photo gate signal GP, and the operation of the thyristor valve will proceed, as it is, to the normal turn-ON of the next cycle.

Next, the following is a description of the case when a surge voltage penetrates into the thyristor valve immediately after turn-OFF, using FIG. 5. Rising rate dv/dt during the reverse voltage period becomes steep due to the penetration of the surge voltage. Therefore, the periods of t1 and t2 become shorter. Thus, output d of signal generating circuit 33 becomes greater than output c of addition circuit 32, that is to say, Equation (4) is not established, even at time T2 at which the absolute value of the reverse voltage becomes less than voltage VR1. Output e of comparator 34 stays "0" and flip-flop 35 is not reset. Therefore, if a forward voltage is applied to thyristors 1-l-1-N, signal FV becomes "1" and the output of AND circuit 37 becomes "1". Thus, light-emitting diodes 40-l-40-N are driven by signal GP, and all thyristors 1-l-1-N are fired.

According to the embodiment of this invention as described above, protection gate pulses are transmitted to all the thyristors. Thus, damage to the thyristors due to an applied surge voltage can be prevented without producing partial commutation failure.

The above description is for an example in which voltage detection circuits which detect the forward voltage and the reverse voltage are provided for all thyristors which are connected in series. However, voltage detection circuits may also be provided for some of the thyristors which are connected in series.

Furthermore, an example has been described in which a signal c which is $[t1+K1\cdot \ln(t2)]$ is obtained by addition circuit 32. However, a signal which is $[t1+t2]$ may be obtained from the addition circuit by omitting the logarithmic circuit.

In the above-described embodiment, time t2 is obtained by providing inversion circuit 22, mono-multi circuit 24, flip-flop 26 and integration circuit 27. But this invention is not limited to this embodiment. For example, instead of these circuits another integration circuit is provided, which integrates signal RV2 and is reset by the output signal of mono-multi circuit 25. A subtractor is further provided, which subtracts the output of this integration circuit from the output of integration circuit 28. The output of the subtractor corresponding to time period t2 is applied to logarithmic circuit 29.

In the above-described embodiment, comparator 34 compares signal c corresponding to the value $[t1+k1\cdot \ln$ (t2)] with signal d corresponding to the value [K1·ln(VR2−VR1)+T0+Tm] in order to determine whether Equation (4) is established or not. This invention is, however, not limited to this embodiment. The rising rate dv/dt of a forwardly rising voltage v applied to the thyristor is calculated by Equation (3) based on a detected time t2. Then, it may be possible that whether or not protection gate pulse is to be outputted is determined by comparing rising rate dv/dt calculated as described above with another predetermined value, directly.

When using this invention as described above, even if a surge voltage penetrates into a thyristor valve after turn-OFF, rising rate dv/dt of the surge voltage is detected and compared with the thyristor turn-OFF time. Thus, damage to the thyristors due to an applied surge voltage can be prevented without producing partial commutation failure by transmitting protection pulses to all the thyristors.

Obviously, numerous modifications and variations of the present invention are possible in light of the above teachings. It is therefore to be understood that within the scope of the appended claims, the invention may be practiced otherwise than as specifically described herein.

What is claimed is:

1. A protection system for a thyristor valve composed of a plurality of thyristors connected in series, comprising:

forward voltage detection means connected to at least one thyristor out of said plurality of said thyristors for detecting that a forward voltage is applied to said thyristor to generate a forward voltage signal;

first reverse voltage detection means connected to said thyristor for detecting that a reverse voltage in excess of a first reverse voltage level is applied to said thyristor to generate a first reverse voltage signal;

second reverse voltage detection means connected to said thyristor for detecting that a reverse voltage in excess of a second reverse voltage level larger than said first reverse voltage signal is applied to said thyristor to generate a second reverse voltage signal; and protection means for receiving said forward voltage signal from said forward voltage detection means, said first reverse voltage signal from said first reverse voltage detection means and said second reverse voltage signal from said second reverse voltage detection means, for detecting a first time period during when said first reverse voltage signal is outputted and a second time period during when said first reverse voltage signal is outputted and said second reverse voltage signal is not outputted, for adding said first time period and said second time period to generate an addition signal, for comparing said addition signal with a first predetermined value to generate a decision signal when said addition signal is smaller than said first predetermined value, and for generating a protection gate pulse based on said decision signal when said forward voltage signal shows that said forward voltage is applied to said thyristor;

said protection gate pulse being applied to said plurality of said thyristors.

2. The protection system according to claim 1, wherein said protection means includes:

first time period detecting means for detecting said first time period during when said first reverse voltage signal is outputted;

second time period detecting means for detecting said second time period during when said first reverse voltage signal is outputted and said second reverse voltage signal is not outputted;

adding means for adding said first time period and said second time period to generate said addition signal;

comparing means for comparing said addition signal with said first predetermined value to generate said decision signal when said addition signal is smaller than said first predetermined value, and protection gate pulse generating means for generating said protection gate pulse based on said decision signal when said forward voltage signal shows that said forward voltage is applied to said thyristor.

3. The protection system according to claim 2, wherein said protection means further includes:

logarithmic means connected to receive said second time period for generating a natural logarithm of said second time period; and said natural logarithm is applied to said adding means as said second time period.

4. The protection system according to claim 3, wherein in said protection means:

said first time period detecting means includes a first integration circuit for integrating said first reverse voltage signal to generate said first time period;

said second time period detecting means includes a second integration circuit for integrating said first reverse voltage signal when said second reverse voltage is not outputted to generate said second time period;

said logarithmic means includes a logarithmic circuit connected to receive said second time period for generating said natural logarithm of said second time period;

said adding means includes an addition circuit for adding said first time period and said natural logarithm of said second time period to generate said addition signal; and said comparing means includes a comparator for comparing said addition signal with said first predetermined value to generate said decision signal, said first predetermined value being decided by a difference between said first reverse voltage level and said second reverse voltage level.

5. The protection system according to claim 2, wherein second time period detecting means includes:

third time period detecting means for detecting a third time period during when said second reverse voltage signal is outputted; and subtracting means for subtracting said third time period from said first time period to generate said second time period.

6. A protection system for a thyristor valve composed of a plurality of thyristors connected in series, comprising:

forward voltage detection means connected to at least one thyristor out of said plurality of said thyristors for detecting that a forward voltage is applied to said thyristor to generate a forward voltage signal;

first reverse voltage detection means connected to said thyristor for detecting that a reverse voltage in excess of a first reverse voltage level is applied to said thyristor to generate a first reverse voltage signal;

second reverse voltage detection means connected to said thyristor for detecting that a reverse voltage in excess of a second reverse voltage level larger than said first reverse voltage signal is applied to said thyristor to generate a second reverse voltage signal; and protection means for receiving said forward voltage signal from said forward voltage signal detection means, said first reverse voltage signal from said first reverse voltage detection means and said second reverse voltage signal from said second reverse voltage detection means for calculating a signal dependent on a rising rate of a forwardly rising voltage applied to said thyristor based on said reverse voltage signal and said second reverse voltage signal when said reverse voltage is applied to said thyristor, for comparing said rising rate dependent signal with a second predetermined value to generate a decision signal when said rising rate dependent signal indicates that said rising rate is larger than a predetermined value, and for generating a protection gate pulse based on said decision signal when said forward voltage signal shows that said forward voltage is applied to said thyristor;

said protection gate pulse being applied to said plurality of thyristors.

7. The protection system according to claim 6, wherein said protection means includes:

means for detecting a first time period during when said first reverse voltage signal is outputted;

means for detecting a third time period during when said second reverse voltage signal is outputted;

means for calculating a time difference between said first time period and said second time period to generated said time difference as a second time period;

means for generating a voltage difference between said first reverse voltage level and said second reverse voltage level;

means for dividing said voltage difference by said second time period to generate a quotient as said rising rate of said forwardly rising voltage;

means for comparing said rising rate with said second predetermined value to generate said decision signal when said rising rate is larger than said second predetermined value; and means for generating said protection gate pulse based on said decision signal when said forward voltage signal shows that said forward voltage is applied to said thyristor.

* * * * *